(12) United States Patent
Huang et al.

(10) Patent No.: US 9,378,954 B2
(45) Date of Patent: Jun. 28, 2016

(54) PLASMA PRE-TREATMENT FOR IMPROVED UNIFORMITY IN SEMICONDUCTOR MANUFACTURING

(71) Applicant: WaferTech, LLC, Camas, WA (US)

(72) Inventors: Cuker Huang, Vancouver, WA (US); Yihguei Wey, Camas, WA (US)

(73) Assignee: WAFERTECH, LLC, Camas, WA (US)

( * ) Notice: Subject to any disclaimer, the term of this patent is extended or adjusted under 35 U.S.C. 154(b) by 104 days.

(21) Appl. No.: 14/206,671

(22) Filed: Mar. 12, 2014

(65) Prior Publication Data

US 2014/0273479 A1 Sep. 18, 2014

Related U.S. Application Data

(60) Provisional application No. 61/792,989, filed on Mar. 15, 2013.

(51) Int. Cl.
| | |
|---|---|
| *H01L 21/308* | (2006.01) |
| *H01L 21/027* | (2006.01) |
| *H01L 21/033* | (2006.01) |
| *H01L 21/3065* | (2006.01) |
| *H01L 21/311* | (2006.01) |
| *H01L 21/3213* | (2006.01) |
| *H01L 21/28* | (2006.01) |
| *H01L 21/66* | (2006.01) |

(52) U.S. Cl.
CPC ........ *H01L 21/0273* (2013.01); *H01L 21/0338* (2013.01); *H01L 21/28123* (2013.01); *H01L 21/3065* (2013.01); *H01L 21/3088* (2013.01); *H01L 21/31138* (2013.01); *H01L 21/32137* (2013.01); *H01L 21/32139* (2013.01); *H01L 22/12* (2013.01)

(58) Field of Classification Search
CPC ............... H01L 21/31138; H01L 21/0337; H01L 21/0338; H01L 21/0273; H01L 21/3065; H01L 21/3083; H01L 21/3086; H01L 21/3088; H01L 21/28123; H01L 21/32137; H01L 21/32139
USPC .......... 438/706, 734, 671, 947, 950; 430/313, 430/314
See application file for complete search history.

(56) References Cited

U.S. PATENT DOCUMENTS

| | | | | |
|---|---|---|---|---|
| 5,474,650 A | * | 12/1995 | Kumihashi | ........ H01J 37/32082 156/345.26 |
| 7,018,780 B2 | * | 3/2006 | Vahedi | ..................... G03F 7/427 216/37 |
| 7,354,847 B2 | * | 4/2008 | Chan | ................... H01L 21/0271 257/202 |
| 2005/0227152 A1 | * | 10/2005 | Yan | ......................... C03C 17/36 430/5 |
| 2011/0163420 A1 | * | 7/2011 | Valdivia | ............. H01L 21/0273 257/618 |

* cited by examiner

*Primary Examiner* — Michael Trinh
(74) *Attorney, Agent, or Firm* — Duane Morris LLP

(57) ABSTRACT

Methods for forming a semiconductor devices are provided. A plasma pre-treatment operation is performed on a photoresist pattern formed over a material disposed over a substrate, and reduces critical dimensions (CDs) of features of the photoresist pattern to a greater extent at a central portion of the substrate than at outer portions of the substrate, thereby forming a treated pattern with a gradient of CDs. The material is then etched using the treated pattern as a photomask. An overetch operation that tends to reduce CDs of the etched features of the material to a greater extent at outer portions of the substrate than at the central portion of the substrate, is employed. The plasma pre-treatment operation is designed in conjunction with the overetch characteristics and, in combination, the operations produce etched features having CDs with a high degree of uniformity across the substrate.

20 Claims, 3 Drawing Sheets

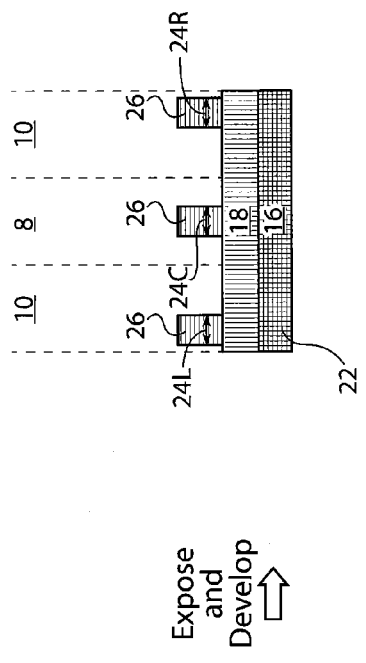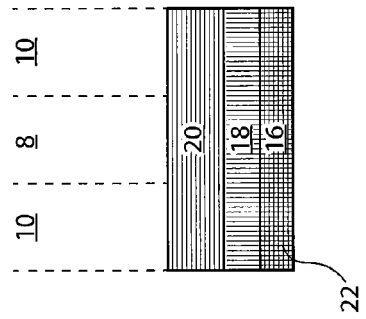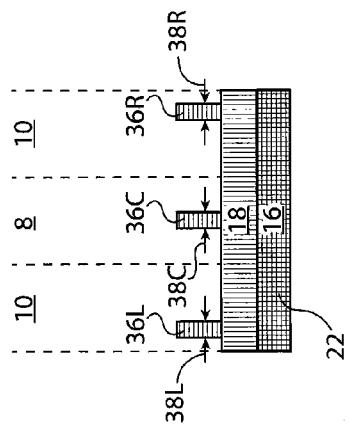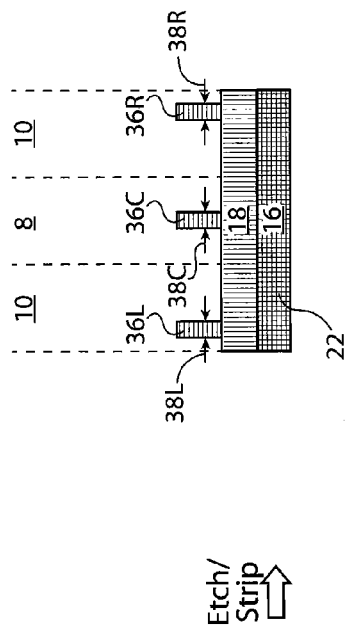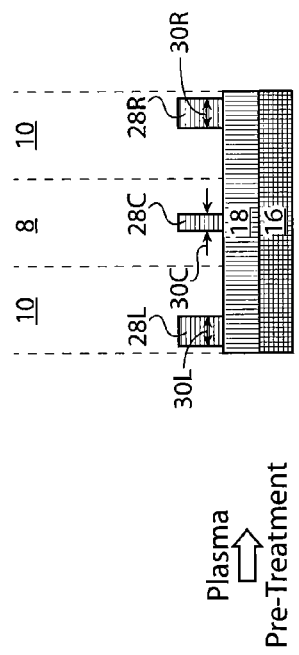

PLASMA PRE-TREATMENT FOR IMPROVED UNIFORMITY IN SEMICONDUCTOR MANUFACTURING

RELATED APPLICATION

This regular U.S. patent application claims priority to U.S. Provisional Application titled PPP Etching CD Uniformity Improvement Methodology, Ser. No. 61/792,989 filed Mar. 15, 2013, the contents of which are hereby incorporated by reference as if set forth in their entirety.

TECHNICAL FIELD

The disclosure relates, most generally, to semiconductor device manufacturing and more particularly to a methodology for improving after-etch critical dimension "CD" uniformity.

BACKGROUND

In today's rapidly advancing semiconductor manufacturing industry, there is a constant drive to reduce feature sizes of the various devices, features and components that combine to form integrated circuits and other semiconductor devices. Examples of features for which reduced feature sizes are desired include contacts and vias, transistor gates, leads of polysilicon and other semiconductor materials, conductive wires and various other device features and components. There is an associated drive to increase integration levels within a chip, i.e. the integrated circuit or other semiconductor device, by integrating a greater number of functional components onto a single chip. There is also a continued drive to increase the substrate size upon which chips are formed. An increased substrate size enables a greater number of chips and components to be formed on a single substrate using a single sequence of processing operations, i.e., at the same time. As the number of individual chips and components formed on a substrate increases, costs are decreased accordingly.

In order to achieve the goals of both decreased feature sizes and increased number of chips and components on larger substrates, it is desirable to maintain uniformity across a substrate.

In many plasma etching operations, however, the physics of the processing chamber often results in overetch operations being more aggressive on the outer portions of the substrate than in the center of the substrate. If the critical dimensions (CD's) of device features are relatively uniform prior to the etching operation, this more aggressive overetching at the edges often results in the features at the outer portions of wafers having diminished CD's and reduced CD's relative to the center of the substrate, i.e. non-uniformity of CD's across the substrate. Previous attempts at correcting this problem include intentionally creating a non-uniformity of CD's after develop and prior to etching. This approach, however, renders the CD data after develop meaningless and makes it difficult to accurately monitor and control the photoresist patterning process.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 2A-2G show a sequence of processing operations according to various embodiments of the disclosure and which produce post-etching CD uniformity across a substrate.

DETAILED DESCRIPTION

Various embodiments of the disclosure provide for creating non-uniformities in ADI-CDs (after develop inspect, critical dimensions) after a photoresist pattern has been formed with relatively uniform CDs. The treated photoresist pattern with intentionally non-uniform ADI-CDs counteracts the non-uniformities associated with plasma overetching processes and, in combination, the sequence of processes produce uniformity of etched device features across a substrate.

Various embodiments of the disclosure provide for providing a substrate with a layer or layers of material and forming a photoresist pattern over the layer of material. The photoresist pattern includes relatively uniform CDs across the substrate after develop. In an embodiment, a plasma pre-treatment operation is used to reduce CDs of the photoresist pattern in the central portion of the substrate. In an embodiment, a gradient of CD reduction is achieved with the degree of CD reduction increasing along with distance from an edge of the substrate. An etching operation is then used, along with an overetch that tends to overetch to a greater extent toward the outer portion of the substrate. In this manner, when CDs are relatively uniform across the substrate after develop, the two countervailing operations of the plasma pre-treatment and the overetch work in conjunction to produce CDs that are uniform throughout the substrate i.e. have a high degree of uniformity, i.e., less variation, after etching.

Figure 1:
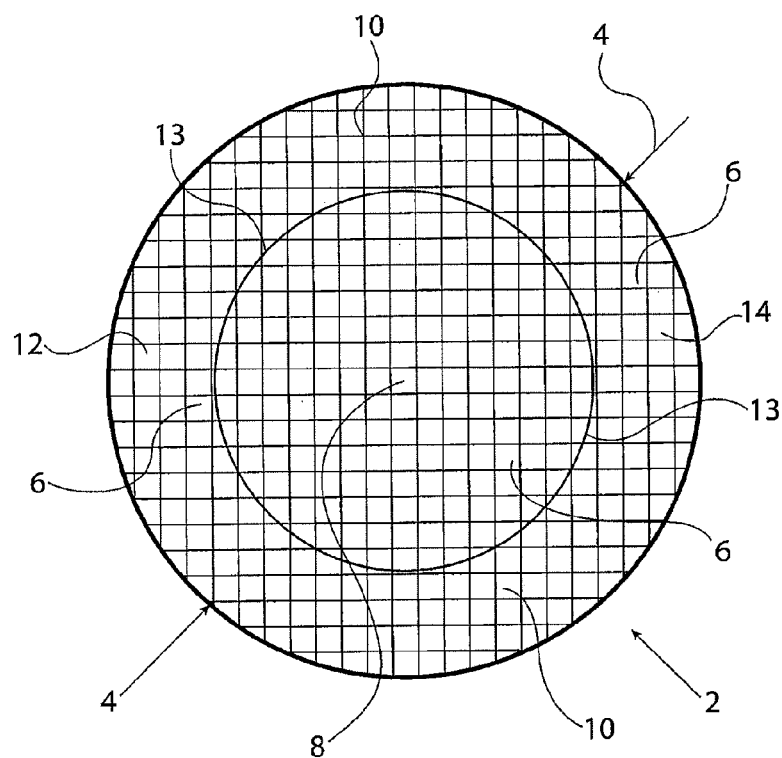
FIG. 1 shows a substrate with multiple chips that have improved uniformity according to various embodiments of the disclosure.

FIG. 1 is a plan view showing substrate 2. Substrate 2 is a silicon wafer in some embodiments, but other substrate materials are used in other embodiments. Substrate 2 includes diameter 4 that ranges from about 4 inches to about 12 or 14 inches in various embodiments but other dimensions are used in other embodiments as the substrates used in semiconductor fabrication are available in various sizes. Substrate 2 includes a multitude of chips 6 formed throughout substrate 2. Each chip 6 represents an integrated circuit or other semiconductor device and various different types of integrated circuits and semiconductor devices are used in various embodiments. Various embodiments relate to the fabrication of various types of integrated circuits or other semiconductor devices formed on a substrate. In some embodiments, substrate 2 includes a central portion 8 and an outer portion 10 separated by boundary 13. Boundary 13 represents the boundary between central portion 8 and outer portion 10 in the illustrated embodiment, but boundary 13 can be positioned at any of various locations in various other embodiments. The uniformity of dimensions of features across substrate 2 is regularly measured, monitored and controlled. For a particular feature such as, but not limited to a critical dimension of a feature formed in a photoresist pattern or after etching, it is desirable for this feature to include the same dimensions in center portion 8 as in outer portion 10. Similarly, it is desirable for this device feature to have the same dimensions at various locations throughout the substrate. Various embodiments of the disclosure provide this desired uniformity.

FIG. 2A shows material 18 disposed over substructure 16. Substructure 16 includes a substrate such as substrate 2 in FIG. 1 and one or several layers of materials formed over the substrate in some embodiments. In some embodiments, substructure 16 represents only a substrate such as a silicon or other semiconductor substrate, with no films formed over the substrate. In an embodiment, material 18 is formed over upper surface 22 of substructure 16. In some embodiments, upper surface 22 of substructure 16 is a surface of a dielectric layer disposed over a substrate. In some embodiments, material 18 is a film or layer formed over substructure 16. In an embodiment, material 18 is a layer of polysilicon formed over substructure 16. In an embodiment, material 18 is a layer of polysilicon formed over a dielectric layer that forms upper surface 22 of substructure 16. Photoresist material 20 is formed over material 18 in the illustrated embodiment. Various photoresists are used. In other embodiments, not shown, an additional film is disposed between material 18 and photoresist material 20. According to some embodiments, a hard mask film is formed between material 18 and photoresist material 20. In some embodiments, a BARC (bottom anti-reflective coating) film, is used immediately prior to coating with photoresist material 20 and is disposed between material 18 and photoresist material 20.

A photoresist patterning operation is then carried out using any of various exposure and develop operations at the Expose and Develop operation shown in FIG. 2B, to produce the structure shown in FIG. 2C. FIG. 2C shows three photoresist structures 26 formed over material 18. Photoresist structures 26 are discrete structures and are representative of hundreds or thousands of such features that appear on each chip 6 on substructure 16 and are also representative of millions of such features formed on and across substructure 16. In an embodiment, photoresist structures 26 each represent a photomask for forming a transistor gate, but in other embodiments, photoresist structures 26 are used to form other features. The three photoresist structures 26 illustrated in FIG. 2C are therefore illustrative of the multitude of such features that are formed along a cross-section such as the one shown in FIG. 2C.

In the illustrated embodiment, one photoresist structure 26 is formed in central portion 8 of substructure 16 and there are two photoresist structures 26 formed in outer portions 10 of substructure 16. The illustrated photoresist structures 26 are illustrative of a multitude of such discrete photoresist segments formed throughout central portion 8 and outer portions 10 of substructure 16.

The widths of the photoresist structures 26 are referred to as critical dimensions ("CDs") and in the illustration of FIG. 2C, they represent after develop inspect-CDs ("ADI-CDs"). CD's, critical dimensions, are the physical dimensions of the geometrical features (width of interconnect line, contacts, trenches, spacings between features, etc.) formed during semiconductor device/circuit manufacturing using given technology. The width of each of the photoresist structures 26 directly influences the width of the physical device feature formed using the corresponding photoresist structure 26 as a photomask. Still referring to FIG. 2C, photoresist structure 26 on the left-hand side portion 10 of substructure 16 includes critical dimension 24L. The photoresist structure 26 formed in the central portion 8 of substructure 16 illustrated in FIG. 2C includes critical dimension 24C. The photoresist structure 26 on the right-hand side portion 10 of substructure 16 shown in FIG. 2C includes a critical dimension of 24R. It can be seen that each of the critical dimensions—24L, 24C and 24R—is the same at the point in the processing operation illustrated in FIG. 2C, i.e. after develop. Each of photoresist structures 26 represents a feature in a photoresist pattern formed over substructure 16. In various embodiments, the critical dimensions, i.e. 24L, 24C and 24R, are in the range of about 1.5-5.0 microns, but other CDs are used in other embodiments.

At FIG. 2D, a plasma pre-treatment operation is carried out to form the structure shown in FIG. 2E, from the structure shown in FIG. 2C. FIG. 2E shows that, after treatment, the critical dimensions of the patterned photoresist features (treated photoresist features 28L, 28C and 28R, described further below) are reduced in the center of substructure 16 relative to the critical dimensions after treatment on the right and left sides of the drawing, i.e. the photoresist feature CDs are reduced in central portion 8 of substructure 16 relative to the CDs in outer portions 10 of substructure 16.

The plasma pre-treatment operation of FIG. 2D is characterized as a low-pressure operation that is highly chemical in nature, i. e. the reaction between the etchant species and the material being etched is more chemical than physical in nature. The plasma pre-treatment operation is chosen in conjunction with the known characteristics of the subsequent overetch process that will be used, i.e. the overetch process associated with the etching process used to form discrete device features from the photoresist pattern. According to some embodiments, the etching process includes an overetch operation with a pressure that is sufficiently high to reduce physical ion bombardment and which produces a higher lateral chemical etch rate on the substrate edge than at the central portion of the substrate, as described further below. According to this embodiment, the overetching process reduces after-etch CDs at the outer regions, e.g. outer portions 10 relative to after-etch CDs in the center portion, e.g. central portion 8. The plasma pre-treatment operation does the opposite. The plasma pre-treatment operation reduces CDs in the center of the substrate, e.g. central portion 8 of substructure 16, relative to the CDs of the photoresist features at outer regions of the substrate, i.e. outer portions 10 of substructure 16.

The plasma pre-treatment operation includes a pressure of about 10-20 millitorr in some embodiments, but other pressures are used in other embodiments. In some embodiments, backside Helium is used to maintain a better heat exchange efficiency and a superior within-wafer temperature uniformity when delivered to the backside of the substrate, i.e. the temperature is uniform across the substrate. He (Helium) is delivered to the backside of the substrate to provide a within-wafer heat exchange rate uniformity between wafer and the chuck which is an ESC (Electro-Static Chuck) in some embodiments and which retains the substrate during plasma processing. In some embodiments, a helium (He) pressure of about 7-12 for is used, but other He pressures are used in other embodiments. In some embodiments, gas flows of $Cl_2$ and $O_2$ are used and in some embodiments, a total gas flow of about 40-90 sccm is used. In some embodiments, the $Cl_2$ gas flow is greater than an $O_2$ gas flow. In some embodiments, the $Cl_2$ flow forms about 45-70% of the overall gas flow with the $O_2$ flow representing about 30-55% of the overall gas flow. In some embodiments, the $O_2$ gas flow ranges from about 10-30 sccm, and the $Cl_2$ gas flow lies within a range of about 30-60 sccm, but other gas flows are used in other embodiments. In some embodiments, the plasma pre-treatment is carried out in-situ with the sequence of etching operations. The etching chamber used to carry out the plasma pre-treatment and, in some embodiments, also the sequence of etching operations, includes a lower electrode over which the substrate is disposed, and an upper electrode in some embodiments. In some embodiments, the plasma pre-treatment operation includes the upper electrode having a higher power than the lower electrode, and in an embodiment, at least 75% of the overall power applied to the upper electrode. In some embodiments, the power supplied to the upper electrode is about 70-85% of the overall power applied to both upper and lower electrodes, and the power supplied to the lower electrode is about 15-30% of the overall power. In some embodiments, the power supplied to the upper electrode is in the range of about 150-350 watts, and the power supplied to the lower electrode is about 50-250 watts, but other powers and other ratios are used in other embodiments. The foregoing values and parameters have been found to produce a plasma pre-treatment operation that effectively reduces CDs in the center of the substrate, e.g. central portion 8, relative to the CDs of the photoresist features at outer regions of the substrate, i.e. outer portions 10.

The preceding values as used in various embodiments, have been found to be effective in producing the CD treatment and adjustments describe above, but other values and other combinations of values are used in other embodiments.

FIG. 2E shows that after starting with CDs 24L, 24C and 24R that are substantially equivalent in FIG. 2C, the plasma pre-treatment operation reduces the CD of the treated photoresist pattern in the center of the substrate, e.g. CD 28C of central portion 8 of substructure 16 greater than in outer portion 10 of substructure 16, e.g. CD's 28L and 28R. In some embodiments, a gradient of CD loss is achieved in which the greatest CD loss is achieved in the center, e.g. central portion 8, of substructure 16 and the smallest or no CD loss is achieved at the edges of substructure 16, with the amount of CD loss increasing in a gradient as distance from the edge of substructure 16 is increased, i.e. along a radial direction on the surface of substructure 16. The plasma pre-treated developed features experience CD loss on portions of substructure 16. In some embodiments, a lateral CD loss of about 2 nm/sec is achieved at the center of substructure 16 such as in central portion 8. In some embodiments, a gradient of lateral CD loss is achieved, ranging from about a 2 nm/sec CD loss at the center of substructure 16 to essential no CD loss at the edges of substructure 16, but other rates of CD loss for the photoresist features are achieved in other embodiments.

FIG. 2E illustrates a treated photoresist pattern, including treated photoresist features 28L, 28C and 28R. Treated photoresist features 28L, 28C and 28R include treated CDs 30L, 30C and 30R, respectively and are formed from photoresist structures 26. Treated CD 30C is less than treated CDs 30L and 30R, which are substantially the same dimension. Only three treated photoresist features 28 are shown in FIG. 2E, but it should be understood that if an intermediate treated photoresist feature 28 were illustrated between left treated photoresist feature 28L and center treated photoresist feature 28C, the interposed treated photoresist feature would be shown to include a critical dimension between CD 30L and CD 30C. Treated photoresist features 28L, 28C and 28R illustrate an aspect of various embodiments. For a plurality of treated photoresist features formed between treated photoresist feature 28L and treated photoresist feature 28C, the plurality of additional treated discrete photoresist features would be characterized by having increasingly greater critical dimensions along the direction from treated photoresist feature 28C to treated photoresist feature 28L.

An etch/strip operation is carried out in FIG. 2F to produce the structure shown in FIG. 2G. The etch/strip operation includes a breakthrough step, a main etch step, and an overetch step in some embodiments, but other etch processing sequences are used in other embodiments. The etching and overetching operations are directed to etching material 18 and various etching operations with various etching conditions are used to etch the various different embodiments of material 18 covered by embodiments of the disclosure. In an embodiment, the etching operation is a chlorine-based etching operation used to etch material 18 according to the embodiment in which material 18 is polysilicon. According to the embodiment in which a breakthrough operation is used, the breakthrough operation may be directed to breaking through a BARC film, a hard mask film, or a native oxide that may form on material 18 and in various other embodiments, the breakthrough operation designates any of various other operations carried out prior to the main etch step. Various conditions for the breakthrough operations are used in various embodiments. The main etch operation is directed to removing material 18 and various conditions and gaseous species are used in various embodiments.

An overetch operation is associated with and follows the primary etching operation referred to in the art as the "main" etch operation. The overetch operation cleans residue that may not have been completely removed during the main etching operation, i.e. the primary etching operation designed to remove the material being etched. In various embodiments, the overetch operation uses a high pressure, in particular a pressure that is increased relative to pressure in the main etching operation. In an embodiment, in which the main etching operation includes a pressure of about 20 millitorr, the overetch component of the etch operation includes a pressure of about 80 millitorr, but other relative and absolute pressures are used in other embodiments. The overetch process is characterized by a generally high pressure e.g. a pressure greater that the main etching operation as described above). The overetch process is designed to be generally isotropic in nature, and it is known to reduce the CDs of etched features at the outer portions of the substrate such as outer portion 10 of substructure 16 to a greater extent than it reduces CDs of etched features at the center of the substrate, e.g., at central portion 8 of substructure 16, if any CD reduction is produced in the center of the substrate at all. In some embodiments, the overetch process produces a gradient of the degree of CD reduction along a radial direction of the substrate, i.e. along a radial direction of substructure 16 or substrate 2.

The structure shown in FIG. 2G is formed from the structure shown in FIG. 2E and illustrates that uniform CDs are produced after etch because of the combination of the plasma pre-treatment and the etching process including the overetching process. The etching and overetching operations remove material 18 in unmasked areas, i.e. "clearing" the etched materials and exposing upper surface 22 in the illustrated embodiment. FIG. 2G shows etched structures 36L, 36C and 36R having critical dimensions 38L, 38C and 38R, respectively. FIG. 2G shows that critical dimensions 38L, 38C and 38R are substantially equal in lateral dimension even though etched structures 36L, 36C and 36R were formed, respectively, from treated photoresist features 28L, 28C and 28R that had different CDs after the plasma pre-treatment according to various embodiments. This is because the plasma pre-treatment conditions of FIG. 2D are chosen in conjunction with the overetch characteristics of the etch/strip operation of FIG. 2F as described above. Etched structures 36L, 36C and 36R are representative of a multitude of etched structures across the width of the substructure 16, each having substantially the same critical dimensions. Etched structures 36L, 36C and 36R are doped or undoped silicon or polysilicon in some embodiments, but other etched structures are produced in other embodiments.

Although the process conditions of the plasma pre-treatment operation described in conjunction with FIG. 2D are advantageously used as a pre-treatment for a polysilicon etching operation, embodiments of the disclosure are applicable to various types of etching operations. Various embodiments are directed to tailoring a suitable plasma pre-treatment operation in conjunction with a known overetch operation to produce the principles discussed herein.

Figure 3:
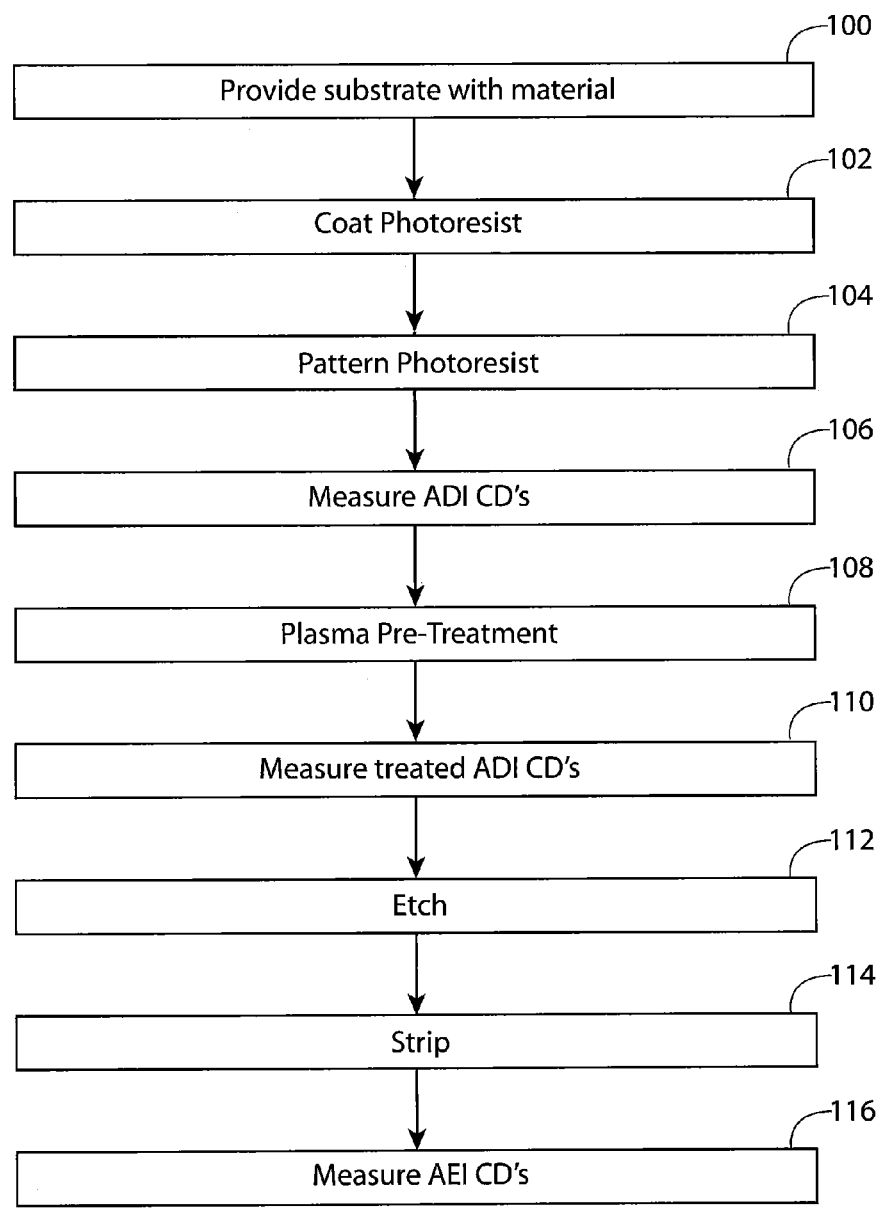
FIG. 3 is a flowchart showing a method according to various embodiments of the disclosure.

FIG. 3 is a flowchart outlining a method according to various embodiments of the disclosure. At provide substrate with material operation 100, a substrate or substructure such as substructure 16, with a material layer such as material 18 shown in FIG. 2A, is provided. At coat photoresist operation 102, a photoresist material 20 is coated to produce the structure shown in FIG. 2A. At pattern photoresist operation 104, the photoresist 20 is exposed and developed to form a pattern such as the pattern including photoresist structures 26 shown in FIG. 2C. At measure ADI-CDs operation 106, various metrology tools are used to measure CDs. At plasma pre-treatment operation 108, the plasma pre-treatment operation such as discussed in conjunction with FIG. 2D, is carried out to produce the structure shown in FIG. 2E. At measure treated ADI-CDs operation 110, various techniques and tools are used to measure the CDs 30L, 30C, 30R, of patterned photoresist features 28L, 28C and 28R after the plasma pre-treatment operation. At etch operation 112, the etching operation is carried out and the etching operation may be a multi-step etching operation including a breakthrough step and other steps. The etch operation includes an overetch in various embodiments. At strip operation 114, the photoresist is removed to produce the structure shown in FIG. 2G and at measure ADI-CDs operation 116, the CDs such as critical dimensions 38L, 38C and 38R are measured using any of various suitable metrology techniques.

According to some embodiments, a method for forming a semiconductor device is provided. The method comprises: forming a photoresist pattern over a material disposed over a substrate; performing a plasma treatment operation that reduces critical dimensions (CDs) of features of the photoresist pattern to a greater extent at a first portion of the substrate than at a second portions of the substrate thereby forming a treated pattern; and etching the material using the treated pattern as a photomask, wherein the second portion is closer to an edge of the substrate than said first portion.

In some embodiments, the first portion is a center portion and the second portion is an outer portion and the etching the material includes an overetch portion that reduces CDs of etched features to a greater extent etching the material includes an overetch portion that reduces CDs of etched features to a greater extent at the outer portions of the substrate than at the central portion of the substrate.

In some embodiments, the material comprises a film.

In some embodiments, the material comprises a layer of polysilicon.

In some embodiments, the material further comprises a hardmask disposed over the layer of polysilicon and the etching includes an operation that etches the hardmask.

In some embodiments, the substrate includes a dielectric layer as an upper portion thereof and the layer of polysilicon is disposed on the dielectric layer.

In some embodiments, the forming a photoresist pattern includes forming the features having a first CD uniformity across the substrate and the performing a plasma treatment produces a gradient of the CDs along a radial direction of the substrate and having a second CD uniformity, wherein the first CD uniformity is greater than the second CD uniformity.

In some embodiments, the etching produces etched features having an etched CD uniformity across the substrate, the etched CD uniformity greater than the second CD uniformity.

In some embodiments, the performing a plasma treatment operation produces a first CD uniformity across the substrate and the etching produces a second CD uniformity higher than the first CD uniformity.

In some embodiments, the performing a plasma treatment includes a pressure less than about 20 millitorr, utilizing $Cl_2$ and $O_2$ in which a $Cl_2$ flow rate of $Cl_2$ is greater than an $O_2$ flow rate of $O_2$ and utilizing a higher power on an upper electrode above an etching surface of the substrate than a lower power provided to a lower electrode upon which the substrate is disposed.

In some embodiments, the upper power ranges from about 150 to about 350 watts, the lower power lies within a range of about 50-250 watts, the $Cl_2$ flow rate lies within a range of about 30 to 60 sccm and the $O_2$ flow rate lies within a range of about 10-30 sccm.

In some embodiments, the upper power represents about 70-85% of a total power of both the upper power and the lower power and the $Cl_2$ flow rate represents about 45-70% of a total flow rate of the $Cl_2$ flow rate and the $O_2$ flow rate.

According to some embodiments, a method for forming a semiconductor device is provided. The method comprises: forming a photoresist pattern over a material disposed on a substrate; and etching by performing a sequence of plasma processing operations including a plasma treatment operation, a breakthrough operation, an etch operation, and an overetch operation, the plasma treatment operation including a pressure less than about 20 millitorr and a total $O_2$ and $Cl_2$ flow rate in a range of about 40-90 sccm in which the $O_2$ flow rate comprises about 30-55% of the total flow rate.

In some embodiments, the etching includes the substrate disposed in an etching chamber and over a lower electrode and wherein the plasma treatment operation includes at least 75% of total power supplied to the etching chamber being supplied to an upper electrode disposed over the substrate.

In some embodiments, the material comprises polysilicon, the treatment operation reduces critical dimensions (CDs) of features of the photoresist pattern to a greater extent at a central portion of the substrate than at outer portions of the substrate and the overetch operation reduces CDs of etched features of the material to a greater extent at the outer portions of the substrate than at the central portion of the substrate.

According to some embodiments, a method for forming a semiconductor device is provided. The method comprises: forming a photoresist pattern over a material disposed on a substrate; performing a plasma treatment operation that reduces critical dimensions (CDs) of features of the photoresist pattern to a greater extent at a first portion of the substrate than at a second portion of the substrate, thereby forming a treated pattern; etching the material using the treated pattern as a photomask thereby creating etched features; and after the etching, using an overetch operation that reduces CDs of the etched features of the material to a greater extent a the second portion of the substrate than at the first portion of the substrate.

In some embodiments, the performing a plasma treatment operation includes: maintaining a pressure less than about 20 millitorr, utilizing $Cl_2$ and $O_2$ gases in which a $Cl_2$ flow rate of $Cl_2$ is greater than an $O_2$ flow rate of $O_2$; and utilizing a higher power on an upper electrode above an etching surface of the substrate than a lower power provided to a lower electrode upon which the substrate is disposed.

In some embodiments, the material comprises a layer of polysilicon disposed on an upper dielectric layer of the substrate.

In some embodiments, the providing a photoresist pattern over the material comprises providing the photoresist pattern having substantially uniform after develop CDs across the substrate, the performing a plasma treatment operation produces a gradient of treated CDs of a treated photoresist pattern, the treated CDs decreasing along with distance from an edge of the substrate, and the overetching results in the etched features of the material having substantially uniform after etch CDs across the substrate.

In some embodiments, the first portion comprises a center portion and said second portion comprises an outer portion and the overetch operation reduces the CDs of the etched features to a greater extent, along a gradient that increases along with distance from a center of the substrate.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a semiconductor device, said method comprising:
    forming a photoresist pattern over a material disposed over a substrate;
    performing a plasma treatment operation that reduces critical dimensions (CDs) of features of said photoresist pattern to a greater extent at a first portion of said substrate than at a second portion of said substrate thereby forming a treated pattern, wherein said second portion is closer to an edge of said substrate than said first portion; and
    etching said material using said treated pattern as a photomask using an etching operation that reduces CDs of features of said material to a greater extent at said second portion than at said first portion thereby forming an etched pattern.

2. The method as in claim 1, wherein said first portion is a center portion and said second portion is an outer portion.

3. The method as in claim 1, wherein said material comprises a film.

4. The method as in claim 1, wherein said material comprises a layer of polysilicon.

5. The method as in claim 4, wherein said material further comprises a hardmask disposed over said layer of polysilicon and said etching includes an operation that etches said hardmask.

6. The method as in claim 4, wherein said substrate includes a dielectric layer as an upper portion thereof and said layer of polysilicon is disposed on said dielectric layer.

7. The method as in claim 1, wherein said forming a photoresist pattern includes forming said features having a first CD uniformity across said substrate and said performing a plasma treatment produces a gradient of said CDs along a radial direction of said substrate and having a second CD uniformity, wherein said first CD uniformity is greater than said second CD uniformity.

8. The method as in claim 7, wherein said etching produces etched features having an etched CD uniformity across said substrate, said etched CD uniformity greater than said second CD uniformity.

9. The method as in claim 1, wherein said performing a plasma treatment operation produces a first CD uniformity across said substrate and said etching produces a second CD uniformity higher than said first CD uniformity.

10. The method as in claim 1, wherein said performing a plasma treatment includes a pressure less than about 20 millitorr, utilizing $Cl_2$ and $O_2$ in which a $Cl_2$ flow rate of $Cl_2$ is greater than an $O_2$ flow rate of $O_2$ and utilizing a higher power on an upper electrode above an etching surface of said substrate than a lower power provided to a lower electrode upon which said substrate is disposed.

11. The method as in claim 10, wherein said upper power ranges from about 150 to about 350 watts, said lower power lies within a range of about 50-250 watts, said $Cl_2$ flow rate lies within a range of about 30 to 60 sccm and said $O_2$ flow rate lies within a range of about 10-30 sccm.

12. The method as in claim 10, wherein said upper power represents about 70-85% of a total power of both said upper power and said lower power and said $Cl_2$ flow rate represents about 45-70% of a total flow rate of said $Cl_2$ flow rate and said $O_2$ flow rate.

13. A method for forming a semiconductor device, said method comprising:
    forming a photoresist pattern over a material disposed on a substrate; and
    etching by performing a sequence of plasma processing operations including a plasma treatment operation, a breakthrough operation, an etch operation, and an overetch operation,
    wherein said plasma treatment operation reduces critical dimensions (CDs) of features of said photoresist pattern to a greater extent at a central portion of said substrate than at outer portions of said substrate and said overetch operation reduces CDs of etched features of said material to a greater extent at said outer portions of said substrate than at said central portion of said substrate.

14. The method as in claim 13, wherein said etching includes said substrate disposed in an etching chamber and over a lower electrode and wherein said plasma treatment operation includes at least 75% of total power supplied to said etching chamber being supplied to an upper electrode disposed over said substrate.

15. The method as in claim 13, wherein said material comprises polysilicon and said plasma treatment operation includes a pressure less than about 20 millitorr and a total $O_2$ and $Cl_2$ flow rate in a range of about 40-90 sccm in which said $O_2$ flow rate comprises about 30-55% of said total $O_2$ and $Cl_2$ flow rate.

16. A method for forming a semiconductor device, said method comprising:
    forming a photoresist pattern over a material disposed on a substrate;
    performing a plasma treatment operation that reduces critical dimensions (CDs) of features of said photoresist pattern to a greater extent at a first portion of said substrate than at a second portion of said substrate, thereby forming a treated pattern;
    etching said material using said treated pattern as a photomask thereby creating etched features; and
    after said etching, using an overetch operation that reduces CDs of said etched features of said material to a greater extent at said second portion of said substrate than at said first portion of said substrate,
    wherein said first portion comprises a center portion and said second portion comprises an outer portion.

17. The method as in claim 16, wherein said performing a plasma treatment operation includes:
    maintaining a pressure less than about 20 millitorr, utilizing $Cl_2$ and $O_2$ gases in which a $Cl_2$ flow rate of $Cl_2$ is greater than an $O_2$ flow rate of $O_2$; and
    utilizing a higher power on an upper electrode above an etching surface of said substrate than a lower power provided to a lower electrode upon which said substrate is disposed.

18. The method as in claim 16, wherein said material comprises a layer of polysilicon disposed on an upper dielectric layer of said substrate.

19. The method as in claim 16, wherein said providing a photoresist pattern over said material comprises providing said photoresist pattern having substantially uniform after develop CDs across said substrate, said performing a plasma treatment operation produces a gradient of treated CDs of a treated photoresist pattern, said treated CDs decreasing along with distance from an edge of said substrate, and said overetching results in said etched features of said material having substantially uniform after etch CDs across said substrate.

20. The method as in claim 16, wherein said overetch operation reduces said CDs of said etched features to a greater extent, along a gradient that increases along with distance from a center of said substrate.

* * * * *